(12) United States Patent
Matsumoto

(10) Patent No.: US 6,316,816 B1
(45) Date of Patent: *Nov. 13, 2001

(54) FILM RESISTOR AND METHOD OF PRODUCING SAME

(75) Inventor: Naoya Matsumoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,194

(22) Filed: May 27, 1998

(30) Foreign Application Priority Data

May 30, 1997 (JP) .................................................. 9-142110

(51) Int. Cl.⁷ .................................................. H01L 29/00
(52) U.S. Cl. .......................................... 257/538; 438/384
(58) Field of Search .................................. 257/538, 537; 438/382, 384

(56) References Cited

U.S. PATENT DOCUMENTS 5,410,183 * 4/1995 Murai ..................................... 257/754

FOREIGN PATENT DOCUMENTS

| | | | |
|---|---|---|---|
| 1-143252 | * 6/1989 | (JP) | ...................................... 257/538 |
| 7-99198 | 4/1995 | (JP) | ........................... H01L/21/3205 |
| 61222237 | 10/1986 | (JP) | ................................ H01L/21/88 |
| 63-137941 | 9/1988 | (JP) | ................................ H01L/21/90 |
| 3108755 | 5/1991 | (JP) | ................................ H01L/27/04 |

* cited by examiner

*Primary Examiner*—Sara Crane
(74) *Attorney, Agent, or Firm*—Hayes, Soloway, Hennessey, Grossman & Hage, PC

(57) ABSTRACT

The disclosure relates to the contacts of a polysilicon resistor for semiconductor integrated circuits. The polysilicon resistor has a resistor pattern of a doped polysilicon film formed on a first dielectric film on a semiconductor substrate. The first dielectric film and the polysilicon resistor pattern are overlaid with a second dielectric film. Each contact window for the polysilicon resistor pattern is opened in the second dielectric film and the polysilicon resistor pattern so as to reach the upper surface of the first dielectric film. It is preferable that the contact windows intrudes into the first dielectric film. As a result, side surfaces of the polysilicon film are exposed in each contact window. The contact windows are filled with a contact metal. The etching process for forming the contact windows does not affect the thickness of the polysilicon film, and only side surfaces of the polysilicon film make contact with the contact metal. Therefore, contact resistance is almost invariable even though the impurity concentration in the polysilicon is gradient in the thickness direction. Besides, the first dielectric film under the polysilicon film can be made thick enough to reduce parasitic capacitance between the polysilicon film and the substrate.

18 Claims, 5 Drawing Sheets

FILM RESISTOR AND METHOD OF PRODUCING SAME

BACKGROUND OF THE INVENTION

This invention relates to a film resistor useful in semiconductor integrated circuits and a method of producing the resistor. A preferred embodiment of the film resistor is a polysilicon (polycrystalline silicon) resistor.

Resistors in semiconductor integrated circuits are classified roughly into two types, viz. diffused resistors and polysilicon resistors. A diffused resistor is made by defining the geometry of a diffused layer in a semiconductor substrate. A polysilicon resistor is made by patterning a polysilicon film which is deposited on a dielectric layer and is doped with an impurity. In general, polysilicon resistors are relatively small in parasitic capacitance and can define relatively high resistance values in relatively small areas.

In the accompanying drawings, FIG. 9 shows a conventional polysilicon resistor. On a silicon substrate 50 there is a field oxide layer 52, and, independent of the polysilicon resistor, a diffused layer 62 is formed in the substrate. Over the field oxide layer 52 and the diffused layer 62 there is a silicon oxide film 54 which is deposited by CVD. For example, the CVD silicon oxide film 54 is 100 nm thick, and the field oxide layer 52 is 500 nm thick. A rectangular pattern of a doped polysilicon film 56 is formed on the silicon oxide film 54. In the area above the diffused layer 62 the polysilicon film 56 does not exist. The polysilicon film 56 and the silicon oxide film 54 are overlaid with another silicon oxide film 58 which is deposited by CVD, and the silicon oxide film 58 is overlaid with a borophospho-silicate glass (BPSG) film 60 which is planarized. A pair of contact windows 64 are opened in the BPSG film 60 and the silicon oxide film 58 above the polysilicon film 56, and another contact window 66 is opened in the BPSG film 60 and silicon oxide films 58 and 54 above the diffused layer 62. As a barrier metal, a TiN film 68 is formed on the surfaces in every contact window 64, 66, and every contact window 64, 66 is filled with a contact metal 70 such as W (tungsten). On the contact metal 70, electrodes or interconnections are provided by a patterned metal film 72 such as an Al—Si—Cu film. In this polysilicon resistor the contact metal 70 connects with the polysilicon film 56 at the upper surface of the polysilicon film.

A problem in the conventional polysilicon resistor is a considerable variation in contact resistance. The sheet resistance of the polysilicon film is primarily determined by the concentration of the impurity doped into polysilicon. Usually the impurity is introduced into the polysilicon film by ion implantation. Therefore, in the doped film the impurity concentration is gradient in the thickness direction. In the fabrication process the contact windows 64 for the polysilicon film 54 and the contact window 66 for the diffused layer 62 are formed simultaneously by an etching process. Therefore, it is inevitable that the polysilicon film 56 undergoes etching to some extent, which is uncontrollable. As a result, the thickness of the polysilicon film 56 under the contact windows 64 is considerably variable, and hence the impurity concentration in the polysilicon film at the bottom of the contact windows 64 is considerably variable. For this reason the contact resistance at the bottom of the contact windows 64 is considerably variable.

To minimize the extent of undesirable etching of the polysilicon film 56 during etching of the silicon oxide film 54 for forming the contact window 66, it is necessary to make the silicon oxide film 54 very thin. For this purpose it is undesirable to make the silicon oxide film 54 thicker than 100 nm. Then, there arises another problem that a parasitic capacitance between the polysilicon film and the silicon surface of the substrate 50 becomes large because of shortness of the distance between the polysilicon film and the silicon surface.

JP-A 3-108755 (1991) proposes a method for lowering contact resistance in polysilicon resistors, and the proposal is applicable to the polysilicon resistor shown in FIG. 9. In that case, contact windows 64 for the doped polysilicon film 56 are formed as shown in FIG. 9. After that, the impurity used for doping the polysilicon film 56 is additionally introduced into the doped polysilicon film 56 through the contact windows 64 in order to produce a high impurity concentration layer adjacent to the bottom of each contact window 64. After that, the contact windows 64 are lined with the barrier metal film 68 and filled with the contact metal 70. Since the impurity concentration in the high impurity concentration layer is nearly constant, the contact resistance at the bottom of each contact window does not significantly vary. However, this method entails additional process steps. In introducing the additional dopant into the polysilicon film, it is necessary to mask several regions where diffused layers and conductive layers of the opposite conductivity are formed. Besides, this method does not solve the problem of parasitic capacitance attributed to the thinness of the silicon oxide film 54 under the polysilicon film 56.

JP-A 61-222237 (1986) proposes another method for lowering contact resistance in polysilicon resistors. FIGS. 10 and 11 show a polysilicon resistor according to JP-A 61-222237. This resistor is fundamentally similar to the resistor shown in FIG. 9, but contact windows are differently designed. In the case of FIGS. 10 and 11, contact windows 64A for the polysilicon film 56 are made wider than the width of the rectangularly patterned polysilicon film 56. In these contact windows 64A, the contact metal 70 makes contact (via the barrier metal film 68) with both the upper surface and side surfaces of the polysilicon film 56. Therefore, the contact resistance becomes low. However, there is no difference in a variation in the thickness of the polysilicon film 56 under the contact windows 64A, and the effect of the widened contact windows 64A is relatively small when the resistor pattern of polysilicon film 56 is relatively large in width. Besides, the widening of the contact windows is of no effect on the parasitic capacitance between the polysilicon film and the silicon substrate.

SUMMARY OF THE INVENTION

It is an object of the present invention to provide a film resistor such as a polysilicon resistor, which is useful in semiconductor integrated circuits, is almost invariable in contact resistance, is small in parasitic capacitance and can be produced without substantially increasing process steps.

It is another object of the invention to provide a method of producing a film resistor which accomplishes the aforementioned object.

A film resistor according to the invention comprises a first dielectric film which lies on a semiconductor substrate, a resistor pattern of a resistive conductor film which is formed on the first dielectric film, a second dielectric film which lies on the first dielectric film and the resistor pattern, and a pair of contacts each of which comprises a contact window which is opened in the second dielectric film and the resistor pattern so as to reach the upper surface of the first dielectric film and a contact metal which fills the contact window and makes contact with the resistor pattern at side surfaces of the resistor pattern exposed in the contact window.

Preferably the aforementioned contact window is opened so as to intrude into the first dielectric film.

In preferred embodiments of the invention, the resistive conductor film is a polysilicon film doped with an impurity.

In this invention, each contact window for the resistor pattern of the conductor film penetrates the total thickness of the second dielectric film and the underlying conductor film. Accordingly in each contact window the contact between the contact metal and the conductor film occurs only at side surfaces of the conductor film exposed in the contact window. The contact metal does not make contact with the upper surface of the conductor film. The contact windows according to the invention can be formed without affecting the thickness of the conductor film even when some other contact windows (such as the contact window 66 in FIG. 9) are simultaneously formed by etching the first and second dielectric films in areas outside of the resistor pattern. Therefore, contact resistance becomes almost invariable even in the case of a polysilicon resistor wherein the impurity concentration in the polysilicon film is gradient in the thickness direction.

Furthermore, in this invention the first dielectric film under the resistor pattern can be made sufficiently thick because the etching process for forming the contact windows (including contact windows for diffused layers under the first dielectric film) does not affect the film thickness of the resistor pattern. Therefore, it is possible to greatly reduce parasitic capacitance between the resistor pattern of the conductor film and the semiconductor substrate.

For producing a film resistor, a method according to the invention comprises the steps of (a) forming a first dielectric film on a semiconductor substrate, (b) forming a resistive conductor film on the first dielectric film, (c) patterning the resistive conductor film to form a resistor pattern on the first dielectric film, (d) forming a second dielectric film on the first dielectric film and the resistor pattern, (e) opening a pair of contact windows in the second dielectric film and the resistor pattern such that each contact window reaches the upper surface of the first dielectric film to expose side surfaces of the resistor pattern in each contact window, and (f) filling the contact windows with a contact metal.

Thus, a resistor according to the invention can be produced without substantially increasing the process steps for producing conventional polysilicon resistors.

DESCRIPTION OF THE PREFERRED EMBODIMENTS

Figure 1:
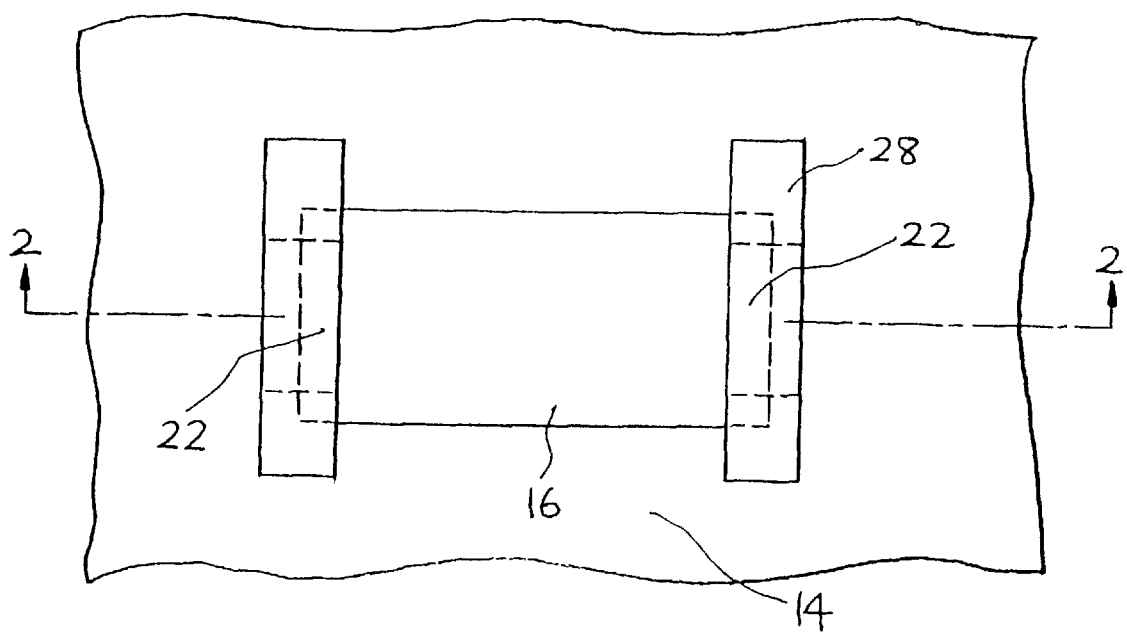
FIG. 1 is a schematic plan view of a polysilicon resistor which is an embodiment of the invention.
Figure 2:
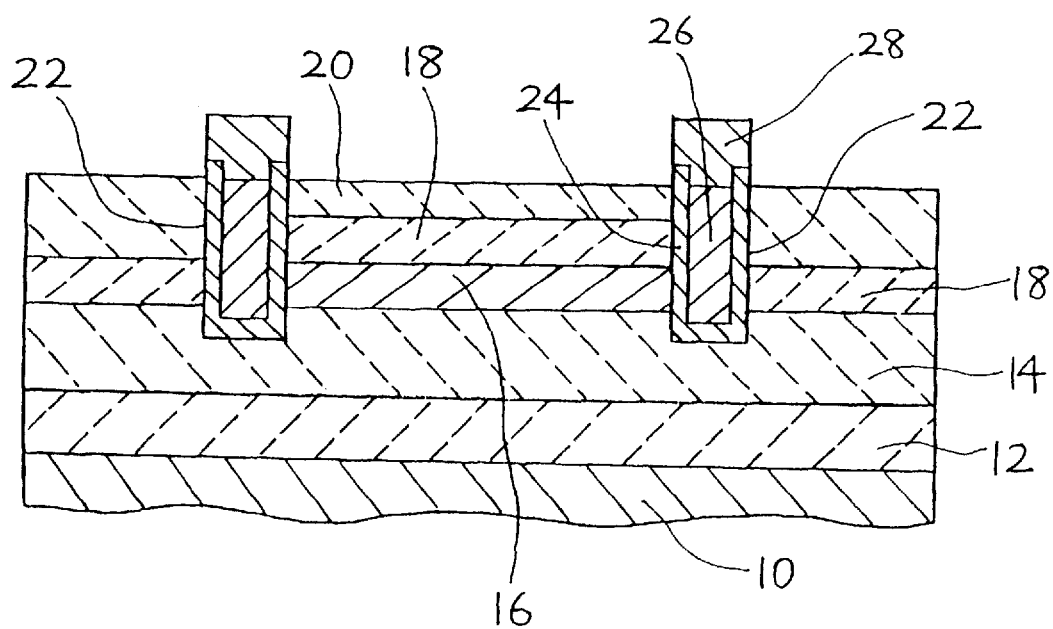
FIG. 2 is a schematic sectional view taken along the line 2—2 in FIG. 1.

FIGS. 1 and 2 show a polysilicon resistor embodying the invention.

On a silicon substrate 10 there is a field oxide layer 12 formed of silicon oxide. On the field oxide layer 12 a silicon oxide film 14 is deposited by CVD. For example, the field oxide layer 12 is 500 nm thick, and the CVD silicon oxide film 14 is 400 nm thick. On the silicon oxide film 14 there is a polysilicon film 16 which is doped with an impurity such as boron, phosphorus or arsenic. For example, the polysilicon film 16 is 100 nm thick. To make a resistor, the polysilicon film is patterned into a rectangular shape. The silicon oxide film 14 and the patterned polysilicon film 16 are overlaid with another silicon oxide film 18 which is deposited by CVD to a thickness of, for example, 100 nm. The silicon oxide film 18 is overlaid with a BPSG film 20 which is planarized. (In FIG. 1, the silicon oxide film 18 and the BPSG film 20 are omitted for simplicity.) For example, the planarized BPSG film 20 is 300 nm thick in the area above the polysilicon film 16.

In areas respectively containing the two opposite ends of the rectangular pattern of polysilicon film 16, a pair of contact windows 22 are opened in the BPSG film 20 and the underlying silicon oxide film 18. The contact windows 22 penetrate the whole thickness of the silicon oxide film 18 and, in regions where the polysilicon film 16 exists under the silicon oxide film 18, the whole thickness of the polysilicon film 16. So, each contact window 22 has the effect of removing an end region of the polysilicon film 16 to expose some side surfaces of the polysilicon film 16. In this embodiment the contact windows 22 slightly intrude into the silicon oxide film 14. As a barrier metal a TiN film 24 is formed on the surfaces exposed in the contact windows 22, and the contact windows 22 are filled with a contact metal 26 such as W (tungsten) deposited by CVD. Therefore, the contact metal 26 connects with the polysilicon film 16 at the side surfaces exposed in each contact window 22. Electrodes or interconnections are provided by another metal film 28 such as an Al—Si—Cu film on the contact metal 26 in the contact windows 22. To provide a barrier metal between this metal film 28 and the BPSG film 20, the TiN film 24 in the contact windows 22 is extended above the upper surface of the BPSG film 20.

Figure 3:
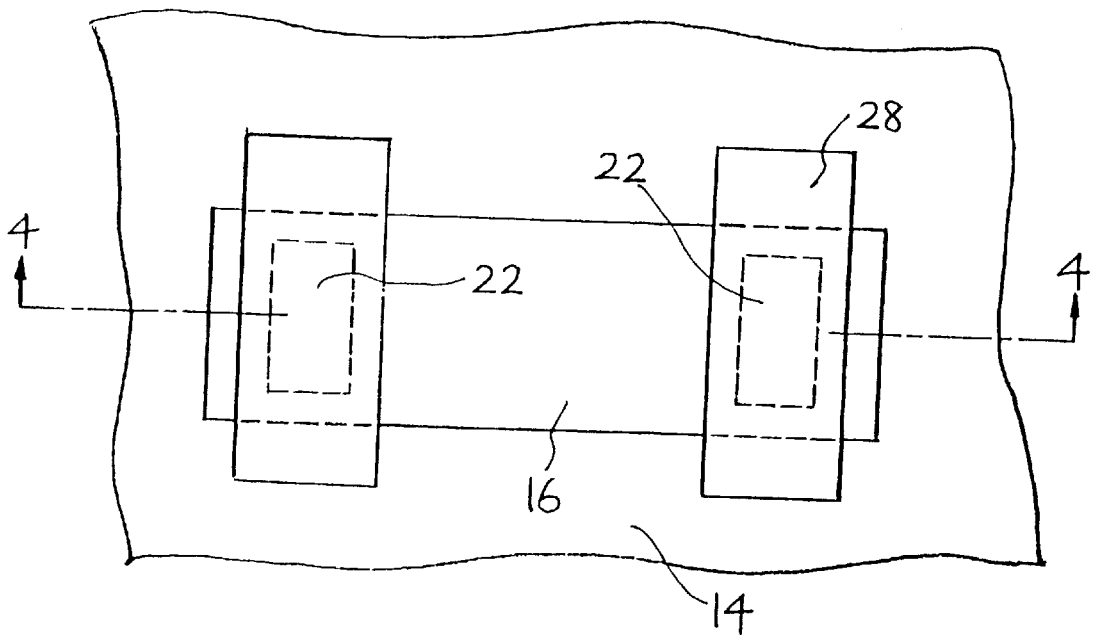
FIG. 3 is a schematic plan view of another polysilicon resistor according to the invention.
Figure 4:
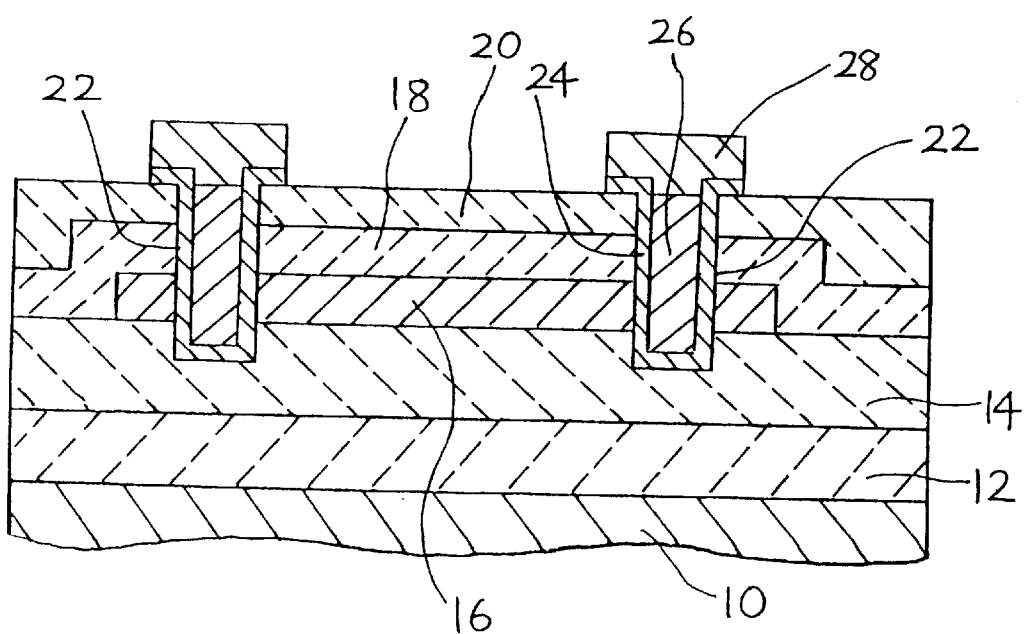
FIG. 4 is a schematic sectional view taken along the line 4—4 in FIG. 3.

FIGS. 3 and 4 show a change in the arrangement of the contact windows 22 in the polysilicon resistor of FIGS. 1 and 2. In other respects, the polysilicon resistor of FIGS. 3 and 4 are similar to the resistor of FIGS. 1 and 2. (In FIG. 3, the BPSG film 20 and the silicon oxide film 18 are omitted for simplicity.)

In FIGS. 3 and 4, the two contact windows 22 for the polysilicon film 16 are positioned at short distances from the two opposite ends of the rectangular pattern of the polysilicon film 16. So, in the area of each contact window 22 the polysilicon film 16 exists under the silicon oxide film 18. The contact windows 22 penetrate the whole thicknesses of the BPSG film 20, silicon oxide film 18 and the polysilicon film 16 and slightly intrudes into the silicon oxide film 14 under the polysilicon film 16. By comparison with the contact windows 22 in FIGS. 1 and 2, the contact windows 22 in FIGS. 3 and 4 expose larger areas of side surfaces of the polysilicon film 16.

The polysilicon resistor of FIGS. 3 and 4 is produced by the following process. (The polysilicon resistor of FIGS. 1 and 2 is produced by fundamentally the same process.)

Figure 5A:
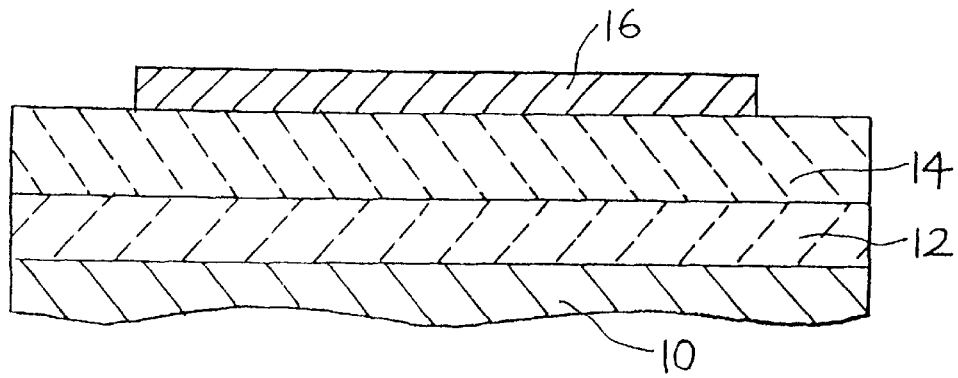
FIGS. 5(A) and 5(B) illustrate several process steps for producing the polysilicon resistor shown in FIGS. 3 and 4.

Referring to FIG. 5(A), the field oxide layer 12 and some diffused layers (not shown) are formed on and in the silicon substrate 10 by conventional techniques.

On the field oxide layer 12 the silicon oxide film 14 is deposited by CVD to a thickness of 400 nm. On the silicon oxide film 14 the polysilicon film 16 is deposited by CVD to a thickness of 100 nm, and the polysilicon film 16 is doped with an impurity. The doped polysilicon film 16 is patterned into a rectangular shape by photolithography and etching.

Figure 5B:
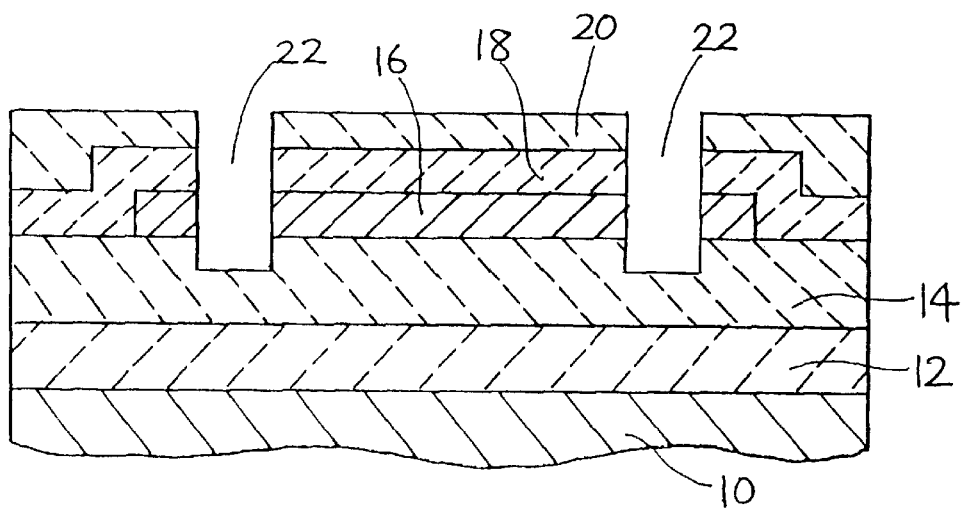
Figure 6:
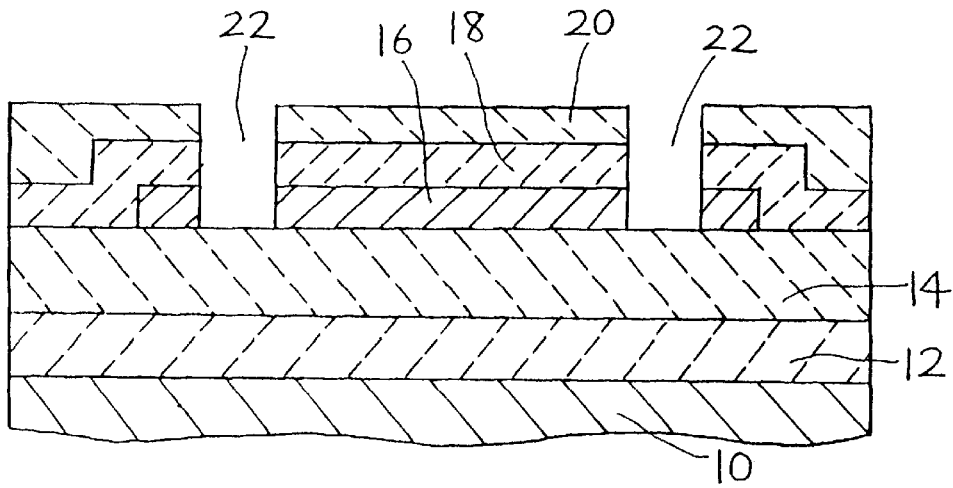
FIG. 6 shows a modification of the contact windows shown in FIG. 5(B)

Referring to FIG. 5(B), the silicon oxide film 18 is deposited to a thickness of 100 nm by CVD on the silicon oxide film 14 and the patterned polysilicon film 16, and the BPSG film 20 is deposited on the silicon oxide film 18. The BPSG film 20 is planarized by a chemical-mechanical polishing (CMP) process. Then the contact windows 22 are opened by photolithography and etching. In FIG. 5(B), the contact windows 22 intrude into the silicon oxide film 14 under the polysilicon film 16. This is preferable but is not a requisite. Referring to FIG. 6, it suffices that the contact windows 22 penetrate the whole thickness of the polysilicon film 16 so as to reach the upper surface of the silicon oxide film 14.

The etching conditions for forming the contact windows 22 are chosen with consideration of the thicknesses of the BPSG film 20, silicon oxides film 18 and the polysilicon film 16 and the etch rates of BPSG, polysilicon and silicon oxide deposited by CVD. In this example, both the etch rate ratio of BPSG to polysilicon and the etch rate ratio of CVD silicon oxide to polysilicon are assumed to be 10:1. (In general, these etch rate ratios are from 8:1 to 12:1.) The polysilicon film 16 is 100 nm thick, and the total thickness of the BPSG film 20 and the silicon oxide film 18 above the polysilicon film 16 is 400 nm. So, in order that the contact windows 22 may penetrate the whole thickness of the polysilicon film 16, etching must be performed for a period of time sufficient to etch a CVD silicon oxide film thicker than 1400 nm. In many cases it is necessary to open another contact window (not shown) in an area above a diffused layer (not shown) in the substrate 10 under the silicon oxide film 14. In that area the patterned polysilicon film 16 does not exist, and the total thickness of the BPSG film 20 and silicon oxide films 18 and 14 is 1000 nm. For this contact window, a 50% overetch is suitable, and hence it is suitable to take an etching time that is sufficient to etch a 1500 nm thick silicon oxide film. With consideration of these factors, the etching time chosen in this example was sufficient to etch a 1500 nm thick silicon oxide film.

After forming the contact windows 22, a TiN film (24) and a W film (26) are successively deposited over the whole area, and the W film 26 is etched back so as to remain only in the contact windows. Then, the Al—Si—Cu film 28 is deposited over the whole area, and the Al—Si—Cu film in unnecessary areas is removed together with the underlying TiN film 24.

Figure 9:
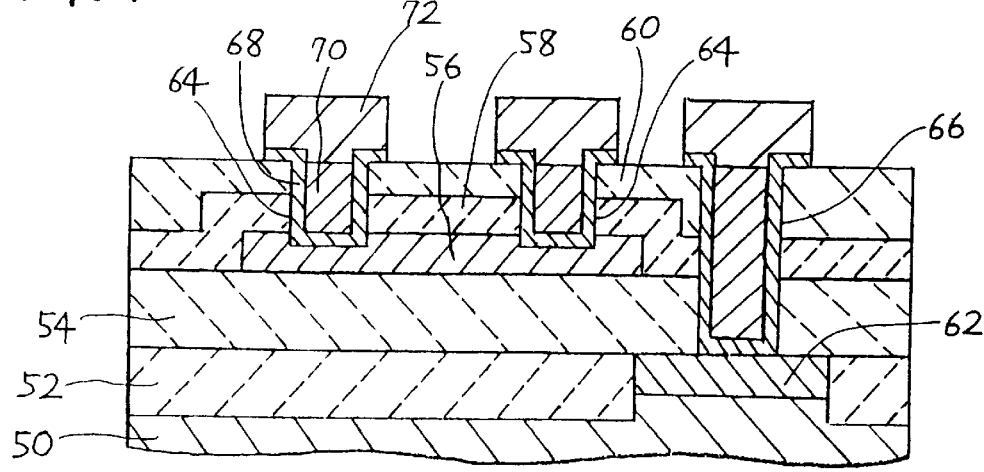
FIG. 9 is a schematic sectional view of a conventional polysilicon resistor.
Figure 10:
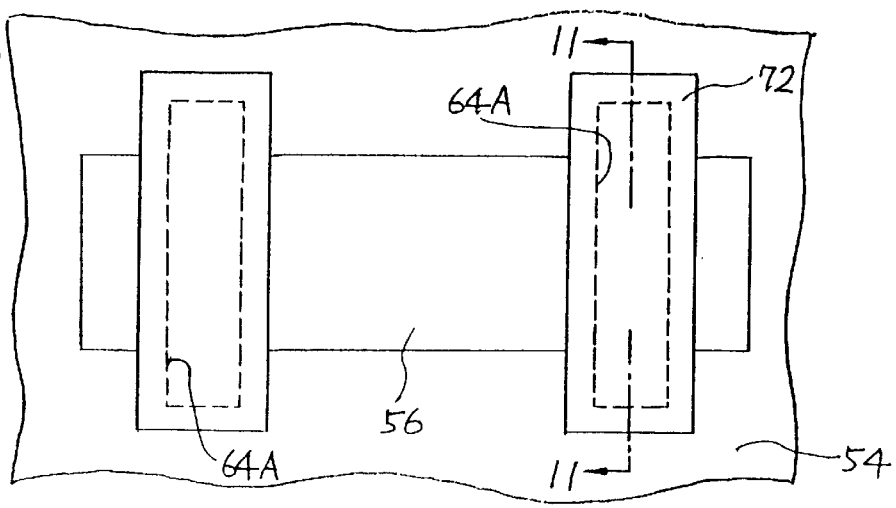
FIGS. 10 and 11 show another known polysilicon resistor in plan and sectional views, respectively.
Figure 11:
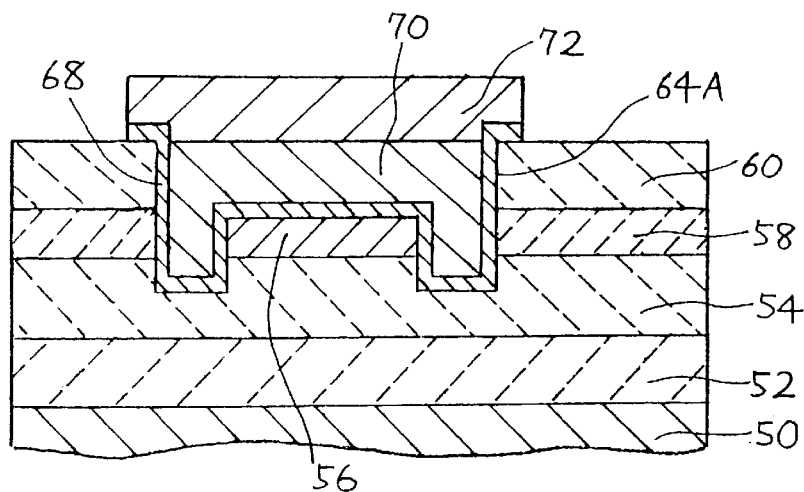

In the embodiments described above, the silicon oxide film 14 under the polysilicon film 16 can be made sufficiently thick (e.g., 400 nm) because the etching process for forming the contact windows 22 together with another contact window for a diffused layer under the silicon oxide film 14 does not affect the thickness of the polysilicon film 16. In the prior art polysilicon resistor shown in FIG. 9 (or FIG. 11), the vertical distance between the polysilicon film 56 and the silicon surface of the substrate 50 is 600 nm since the field oxide layer 52 is 500 nm thick and the silicon oxide film 54 is only 100 nm thick. In the embodiments of the invention the distance between the polysilicon film 16 and the silicon surface of the substrate 10 is 900 nm since the silicon oxide film 14 is made as thick as 400 nm. Therefore, in the embodiments of the invention the parasitic capacitance between the polysilicon film and the silicon substrate decreases to ⅔ of that in the prior art polysilicon resistor of FIG. 9 (or FIG. 11).

Figure 7:
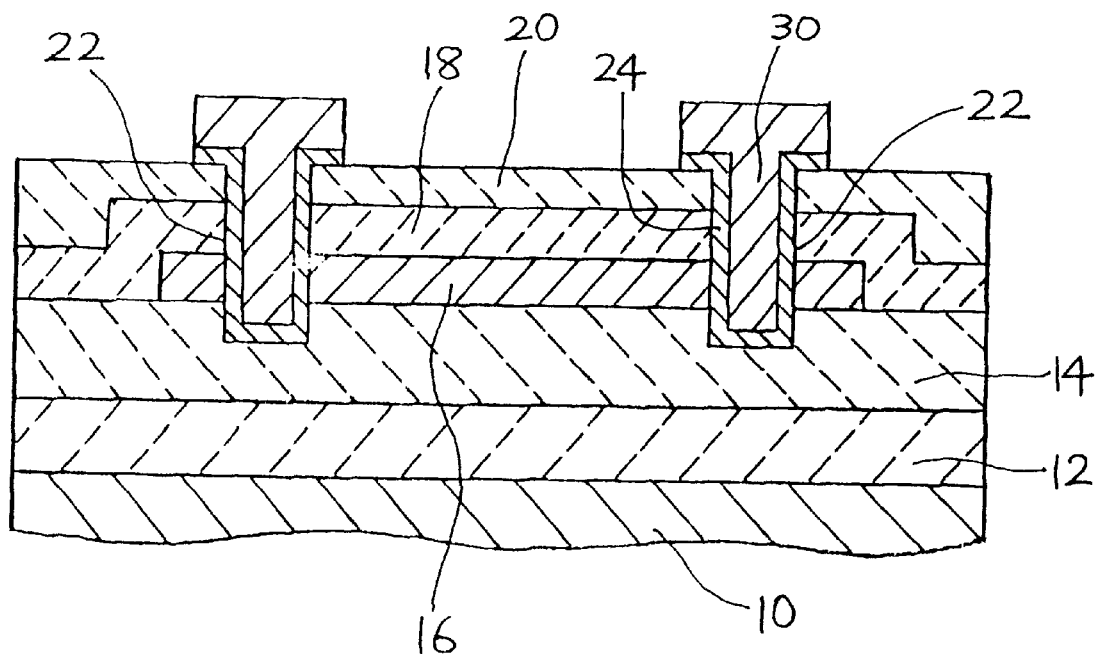
FIG. 7 shows a modification of the metal contacts shown in FIG. 4.

In the embodiments described above, the Al—Si—Cu film 28 to provide electrodes or interconnections is deposited after filling the contact windows 22 with another metal film (W film) 26. This is an option, and FIG. 7 shows another option. In the case of FIG. 7, an Al—Cu film 30 is deposited over the whole area after depositing the barrier metal (TiN) film 24, and the contact windows 22 are completely filled with the Al—Cu film 30 by a reflow treatment of this film 30. After that, the Al—Cu film 30 in unnecessary areas is removed together with the underlying TiN film 24.

Figure 8:
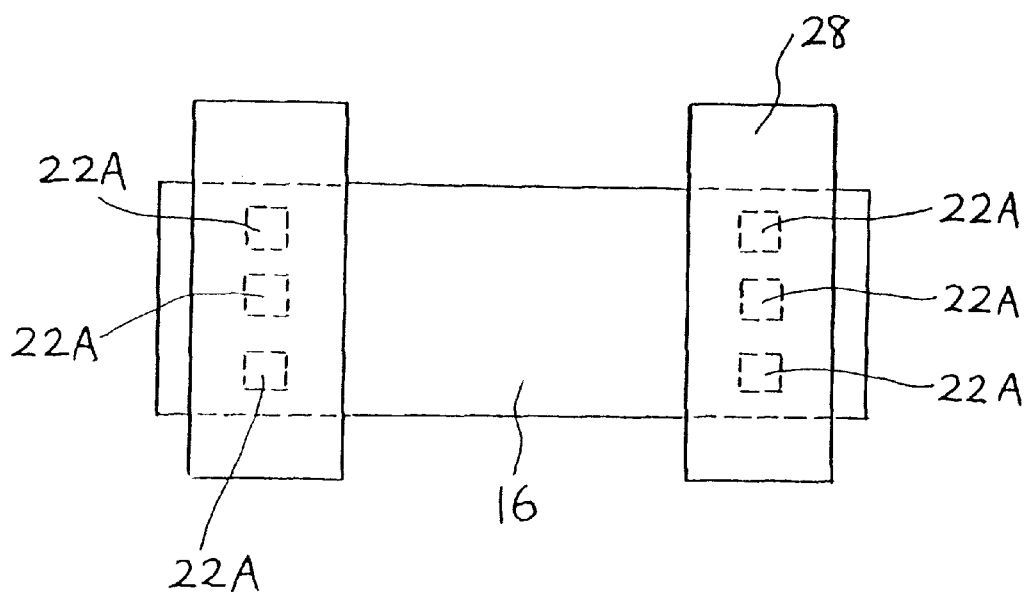
FIG. 8 shows a modification of the geometry of the contact windows shown in FIG. 3.

FIG. 8 shows a design modification of the contact windows 22 in FIG. 3. In some cases it is desirable that all the contact windows on a substrate are square windows of the same width with a view to improving the efficiency of checking mask patterns. In FIG. 8, three square and relatively small contact windows 22A are formed instead of each of the rectangular and relatively large contact windows 22 in FIG. 3. The three contact windows 22A are of the same size and are arranged in a row.

What is claimed is:

1. A film resistor comprising:
   a first dielectric film which lies on a semiconductor substrate;
   a resistor pattern of a resistive conductor film which is formed overlying said first dielectric film;
   a second dielectric film which lies on said first dielectric film and said resistor pattern; and
   a pair of contacts each of which comprises a plurality of contact windows which windows penetrate the entire thickness of said second dielectric film and said resistor pattern so as to intrude into said underlying first dielectric film below the upper surface thereof, and a contact metal which fills said contact windows and makes contact, through a barrier metal film, with said resistor pattern only at side surfaces of the resistor pattern exposed in said contact windows.

2. A film resistor according to claim 1, wherein said contact window intrudes into said first dielectric film.

3. A film resistor according to claim 1, wherein said resistive conductor film is a polysilicon film doped with an impurity.

4. A film resistor according to claim 1, wherein said contact window is opened in an area which partly overlaps an end region of said resistor pattern.

5. A film resistor according to claim 1, wherein said contact window is opened in an area where said resistor pattern exists under said second dielectric film.

6. A method of producing a film resistor as claimed in claim 1, comprising the steps of:
   (a) forming a first dielectric film on a semiconductor substrate;
   (b) forming a resistive conductor film overlying said first dielectric film;
   (c) patterning said resistive conductor film to form a resistor pattern on said first dielectric film;

(d) forming a second dielectric film on said first dielectric film and said resistor pattern;

(e) forming a BPSG film on said second dielectric film;

(f) etching for a period of time sufficient to form a pair of contacts each of which comprises a plurality of contact windows extending through said BPSG film and said second dielectric film and said resistor pattern to penetrate the entire thickness of said BPSG film and said second dielectric film and said resistor pattern such that each contact window intrudes into said underlying first dielectric film below the upper surface thereof to expose side surfaces of said resistor pattern in each contact window;

(g) depositing a barrier metal film on side walls of said contact windows; and (h) filling said contact windows with a contact metal.

7. A method according to claim 6, wherein in the step (e) said contact windows are opened so as to intrude into said first dielectric film.

8. A method according to claim 6, wherein said resistive conductor film is a polysilicon film doped with an impurity.

9. A method according to claim 6, wherein each of said contact windows is opened in an area which partly overlaps an end region of said resistor pattern.

10. A method according to claim 6, wherein each of said contact windows is opened in an area where said resistor pattern exists under said second dielectric film.

11. A film resistor comprising:

a first dielectric film which lies on a semiconductor substrate;

a resistor pattern of a resistive conductor film which is formed overlying said first dielectric film and has two opposite ends;

a second dielectric film which lies on said first dielectric film and said resistor pattern;

a pair of contact windows each of which is formed in the vicinity of one of said two opposite ends of said resistor pattern and penetrates the entire thickness of said second dielectric film and said resistor pattern so as to intrude into said underlying first dielectric film below the upper surface thereof; and a contact metal which fills each of said contact windows and makes contact, through a barrier metal film, with said resistor pattern only at side surfaces of the resistor pattern exposed in each contact window.

12. A film resistor according to claim 11, wherein said pair of contact windows are rectangular windows arranged symmetrically opposite to each other.

13. A method of producing a film resistor, comprising the steps of:

(a) forming a first dielectric film on a semiconductor substrate;

(b) forming a resistive conductor film overlying said first dielectric film;

(c) patterning said resistive conductor film to form a resistor pattern having two opposite ends on said first dielectric film;

(d) forming a second dielectric film on said first dielectric film and said resistor pattern;

(e) forming a pair of contact windows each of which is located in the vicinity of one of said two opposite ends of said resistor pattern and penetrates the entire thickness of said second dielectric film and said resistor pattern so as to intrude into said underling first dielectric film below the upper surface thereof to thereby expose side surfaces of said resistor pattern in each contact window;

(f) depositing a barrier metal film on side walls of said contact windows; and (g) filling each of said pair of contact windows with a contact metal so that the contact metal makes contact with said resistor pattern only at side surfaces of the resistor pattern exposed in each contact window.

14. A method according to claim 13, wherein said pair of contact windows are rectangular windows aranged symmetrically opposite to each other.

15. A film resistor according to claim 1, wherein said barrier metal film comprises a TiN film and said contact metal comprises tungsten.

16. A film resistor according to claim 11, wherein said barrier metal film comprises a TiN film and said contact metal comprises tungsten.

17. A method according to claim 6, wherein said barrier metal film comprises TiN, and said contact metal comprises tungsten.

18. A method according to claim 13, wherein said barrier metal film comprises TiN, and said contact metal comprises tungsten.

* * * * *